(12) United States Patent
Diao et al.

(10) Patent No.: US 9,642,258 B2
(45) Date of Patent: May 2, 2017

(54) ALL-ORGANIC INDUCTOR-CAPACITOR TANK CIRCUIT FOR RADIO FREQUENCY SENSOR APPLICATIONS

(71) Applicant: Brewer Science Inc., Rolla, MO (US)

(72) Inventors: Liyong Diao, Springfield, MO (US);
Wu-Sheng Shih, Ozark, MO (US);
James E. Lamb, III, Rolla, MO (US);
Christopher Landorf, Springfield, MO (US)

(73) Assignee: Brewer Science Inc., Rolla, MO (US)

( * ) Notice: Subject to any disclaimer, the term of this patent is extended or adjusted under 35 U.S.C. 154(b) by 921 days.

(21) Appl. No.: 13/865,841

(22) Filed: Apr. 18, 2013

(65) Prior Publication Data

US 2016/0050757 A1    Feb. 18, 2016

Related U.S. Application Data

(60) Provisional application No. 61/635,119, filed on Apr. 18, 2012.

(51) Int. Cl.
*H01F 27/28* (2006.01)
*H01F 5/00* (2006.01)
(Continued)

(52) U.S. Cl.
CPC ......... *H05K 1/162* (2013.01); *H01F 27/2804* (2013.01); *H01G 4/008* (2013.01); *H01G 4/14* (2013.01); *H01G 4/40* (2013.01); *H05K 1/097* (2013.01); *H05K 1/165* (2013.01); *H05K 1/0313* (2013.01); *H05K 2201/026* (2013.01); *H05K 2201/0323* (2013.01); *H05K 2201/10128* (2013.01); *H05K 2201/10151* (2013.01); *H05K 2201/10159* (2013.01); *H05K 2201/10166* (2013.01); *H05K 2201/10174* (2013.01)

(58) Field of Classification Search
CPC ...................................................... C25D 1/04
See application file for complete search history.

(56) References Cited

U.S. PATENT DOCUMENTS

| 7,982,570 B2 | 7/2011 | Burdick, Jr. et al. |
| 2008/0010796 A1* | 1/2008 | Pan ........................ H01G 11/36 29/25.03 |

(Continued)

OTHER PUBLICATIONS

Abstract of WO2005070825.*

(Continued)

*Primary Examiner* — Elvin G Enad
*Assistant Examiner* — Ronald Hinson
(74) *Attorney, Agent, or Firm* — Hovey Williams LLP

(57) ABSTRACT

The present invention provides novel tank circuits that are totally passive, and they are made of conductive-grade carbon nanotubes (CNTs) on substrates, and preferably flexible substrates. These components and structures contain no traditional electronic materials such as silicon, metal oxides, or ceramics, and they are totally organic. They may be used in applications where the resonant frequency and amplitude of the sensor can be modulated by a thermal, mechanical, or chemical signal, such as temperature, strain, pressure, vibration, or humidity. All-organic, and consequently combustible, passive RF sensors have unique applications for defense and consumer industries.

15 Claims, 7 Drawing Sheets

(51) Int. Cl.
*H05K 1/16* (2006.01)
*H01G 4/008* (2006.01)
*H01G 4/14* (2006.01)
*H01G 4/40* (2006.01)
*H05K 1/09* (2006.01)
*H05K 1/03* (2006.01)

(56) References Cited

U.S. PATENT DOCUMENTS

| | | | | |
|---|---|---|---|---|
| 2008/0180875 | A1* | 7/2008 | Biggs | H01G 2/14 361/273 |
| 2012/0213983 | A1* | 8/2012 | Hladik | H01B 1/04 428/220 |
| 2012/0326093 | A1 | 12/2012 | Landorf | |
| 2013/0288064 | A1 | 10/2013 | Hladik | |

OTHER PUBLICATIONS

Min Ouyang, Jin-Lin Huang, Chin Li Cheung, and Charles M. Lieber, "Energy Gaps in 'Metallic' Single-Walled Carbon Nanotubes," Science, vol. 292, No. 5517, Apr. 27, 2001, pp. 702-705.

J. C. Charlier, "Defects in Carbon Nanotubes," Accounts of Chemical Research, vol. 35, No. 12, 2002, pp. 1063-1069.

Arthur Nieuwoudt, and Yehia Massoud, "Predicting the Performance of Low-Loss On-Chip Inductors Realized Using Carbon Nanotube Bundles," IEEE Transactions on Electron Devices, vol. 55, No. 1, 2008, pp. 298-312.

P. J. Burke, "Lüttinger Liquid Theory as a Model of the Gigahertz Electrical Properties of Carbon Nanotubes," IEEE Transactions on Nanotechnology, vol. 1, No. 3, 2002, pp. 129-144.

Hong Li, and Kaustav Banerjee, "High-Frequency Analysis of Carbon Nanotube Interconnects and Implications for On-Chip Inductor Design," IEEE Transactions on Electron Devices, vol. 56, No. 10, 2009, pp. 2202-2214.

Omar F. Mousa, Bruce C. Kim, Jack Flicker, and Jud Ready, "A Novel Design of CNT-Based Embedded Inductors," 2009 IEEE Electronic Components and Technology Conference, pp. 497-501.

M. Radosavljevic, J. Lefebvre, and A. T. Johnson, "High-field electrical transport and breakdown in bundles of single-wall carbon nanotubes," Physical Review B, vol. 64, No. 24, Dec. 2001, pp. 241307-1-241307-4.

B. Q. Wei, R. Vajtai, and P. M. Ajayan, "Reliability and current carrying capacity of carbon nanotubes," Applied Physics Letters, vol. 79, No. 8, Aug. 2001, pp. 1172-1174.

J. Hone, M. Whitney, C. Piskoti, and A. Zettl, "Thermal conductivity of single-walled carbon nanotubes," Physical Review B, vol. 59, No. 4, 1999, pp. R2514-R2516.

P. Kim, L. Shi, A. Majumdar, and P. L. McEuen, "Thermal Transport Measurements of Individual Multiwalled Nanotubes," Physical Review Letters, vol. 87, No. 21, Oct. 2001, pp. 215502-1-215502-4.

J.-Y. Park, S. Rosenblatt, Y. Yaish, V. Sazonova, H. Ustunel, S. Braig, T. A. Arias, P. W. Brouwer, and P. L. McEuen, "Electron-Phonon Scattering in Metallic Single-Walled Carbon Nanotubes," Nano Letters, vol. 4, No. 3, Feb. 2004, pp. 517-520.

H. J. Li, W. G. Lu, J. J. Li, X. D. Bai, and C. Z. Gu, "Multichannel Ballistic Transport in Multiwall Carbon Nanotubes," Physical Review Letters, vol. 95, No. 8, Aug. 2005, pp. 086601-1-086601-4.

Guosheng Jiang, Liyong Diao, and Ken Kuang; "Improved Manufacturing Process of Cu/Mo70—Cu/Cu Composite Heat Sinks for Electronic Packaging Applications," IEEE Transactions on Components, Packaging and Manufacturing Technology, vol. 1, No. 10, 2011, pp. 1670-1674.

E. Pop, D. Mann, J. Cao, Q. Wang, K. Goodson, and H. J. Dai, "Negative Differential Conductance and Hot Phonons in Suspended Nanotube Molecular Wires," Physical Review Letters, vol. 95, No. 15, 2005, pp. 155505-1-155505-4.

Kevin Loutherback, "High Temperature Resistance of Metallic Single-walled Carbon Nanotubes," Project report, University of California, Irvine, 2006. (reference not attached; unavailable).

* cited by examiner

ALL-ORGANIC INDUCTOR-CAPACITOR TANK CIRCUIT FOR RADIO FREQUENCY SENSOR APPLICATIONS

RELATED APPLICATIONS

This application claims the priority benefit of a provisional application entitled ALL-ORGANIC INDUCTOR-CAPACITOR TANK CIRCUIT FOR RADIO FREQUENCY SENSOR APPLICATIONS, Ser. No. 61/635,119, filed Apr. 18, 2012, incorporated by reference herein.

FEDERALLY SPONSORED RESEARCH OR DEVELOPMENT

This invention was made with government support under contract number WK15QKN-11-9-001-RP1-B awarded by the Department of Defense. The United States Government has certain rights in the invention.

BACKGROUND OF THE INVENTION

Field of the Invention

The present invention is concerned with tank circuits that contain inductors having coils made from carbon nanotube films and/or capacitors having conductive layers formed from carbon nanotube films.

Description of the Prior Art

Passive radio frequency (RF) sensors are useful because they allow information gathering without in situ attachment of powering systems. These sensors can be used for status, situation monitoring, inventory controls, and near field communications. RF sensors made of organic materials such as carbon nanotubes (CNTs), graphene, and conductive polymers are sought in special applications where traditional electronic materials are not allowed. For example, combustible RF thermal sensors for munitions assurance are sought by the military.

There have been attempts to make such sensors without success. A functional CNT inductor in terms of reflection (transmission)/phase characteristics in the operating frequency range of 10-200 MHZ or higher frequency has not been created. One of the issues for CNT inductor coils is their high resistivity. CNT inductors operating in the GHz range are all that has been feasible to date because the required total length of the CNT inductor coils is short for this range, and the total resistance is acceptable.

SUMMARY OF THE INVENTION

The present invention broadly provides a capacitor comprising a first carbon nanotube film, a second carbon nanotube film, and a dielectric layer. The dielectric layer is positioned between the first and second carbon nanotube films, and the carbon nanotube films each have respective resistances of less than about 5 $\Omega$/sq.

In one embodiment, the invention is directed towards an inductor comprising a coil supported on a substrate, where the coil comprises a carbon nanotube film directly on the substrate, and the film has a resistance of less than about 5 $\Omega$/sq.

In a further embodiment, the invention provides a tank circuit comprising one or both of:

a capacitor comprising a first carbon nanotube film, a second carbon nanotube film, and a dielectric layer, where the dielectric layer is positioned between the first and second carbon nanotube films; and an inductor operatively connected to the capacitor, where the inductor comprises a coil supported on a substrate, the coil comprises a third carbon nanotube film directly on the substrate.

In a preferred embodiment of the tank circuit, the first and second carbon nanotube Elms each have respective resistances of less than about 5 $\Omega$/sq, and the third carbon nanotube film has a resistance of less than about 5 $\Omega$/sq.

DETAILED DESCRIPTION OF THE PREFERRED EMBODIMENTS

Tank Circuit Components

Figure 10:
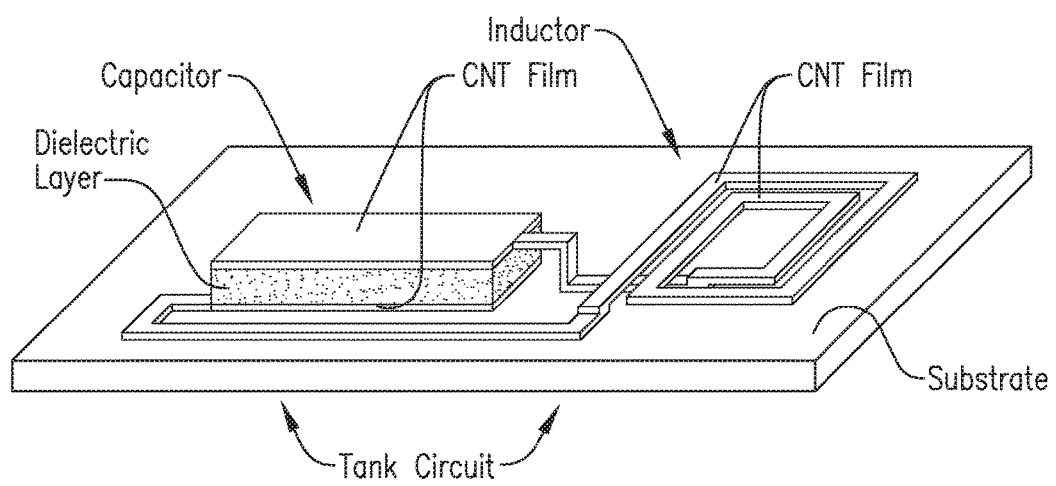
FIG. 10 depicts one possible schematic tank circuit layout according to various embodiments of the present invention particularly illustrating a CNT capacitor operatively connected to a CNT inductor.

The present invention broadly provides novel tank circuits that comprise an inductor and a capacitor, one embodiment of which is shown in FIG. 10. In one embodiment, the capacitor comprises electrodes or conductive films/sheets that are formed from a carbon nanotube film. That is, the capacitor will comprise first and second carbon nanotube films and a dielectric layer, with the dielectric layer being positioned between the first and second films. It will be appreciated that this three-layer system can be constructed similar to that of any conventional capacitor that did not utilize carbon nanotube electrodes (e.g., as plates, sheets, rolled or coiled, etc.). Suitable dielectric layers include polymeric layers, with some exemplary polymeric layers being selected from the group consisting of polyimide, poly(vinylidenefluoride), dedoped polyaniline, polystyrene, polyacrylate, epoxies(including aliphatic epoxies and aromatic epoxies), epoxy acrylates, parylene, polyethylene, and poly(methyl methacrylate) layers. The average thickness of the dielectric layer will be from about 0.01 µm to about 1,000 µm, preferably from about 0.1 µm to about 500 µm, and more preferably from about 0.5 µm to about 100 µm.

Advantageously, the carbon nanotube films serving as the electrodes in the capacitor will have a resistance of less than about 5 $\Omega$/sq, preferably less than about 3 $\Omega$/sq, and more preferably from about 0.1 $\Omega$/sq to about 1 $\Omega$/sq. The total resistance of each capacitor film will individually be less than about 500Ω, preferably less than about 150Ω, more preferably less than about 50Ω, and even more preferably from about 0.5Ω to about 5Ω. The average thickness of the carbon nanotube films in the capacitor will be from about 100 nm to about 1,000 µm, preferably from about 500 nm to about 100 µm, and more preferably from about 3 µm to about 10 µm.

In one embodiment, the carbon nanotube films acting as the electrodes in the capacitor will comprise less than about 5% by weight metal, more preferably less than about 2% by weight metal, and more preferably about 0% by weight metal, based upon the total weight of the film taken as 100% by weight. In another embodiment, the carbon nanotube films will comprise less than about 5% by weight of a polymer, more preferably less than about 2% by weight of a polymer, and more preferably about 0% by weight of a polymer, based upon the total weight of the film taken as 100% by weight. In another embodiment, the carbon nanotube films will comprise less than about 5% by weight of a conductive polymer, more preferably less than about 2% by weight of a conductive polymer, and more preferably about 0% by weight of a conductive polymer, based upon the total weight of the film taken as 100% by weight. In a further embodiment, both of the above low-metal and low-polymer properties are present. In yet a further embodiment, the carbon nanotube films consist essentially of, and preferably consist of, carbon nanotubes.

In another embodiment, the inductor comprises a coil that is a free-standing (i.e., it's not supported or coated on a metal coil or other type of coil) carbon nanotube film. More particularly, the inductor comprises a coil that is directly on the surface of a substrate and not on top of another coil. Suitable substrates includes those selected from the group consisting of polyethylene terephthalate, polyimide, FR-4, breadboard, poly(methyl methacrylate), polyacrylate, epoxy, polyurethane, paper, polyester, and polyethylene substrates. Additionally, although the preferred use will generally be to support the coil on a flat or planar substrate, the substrate could be some sort of three-dimensional shape as well. For example, the substrate could be cylindrical in shape, and the carbon nanotube coil would be wrapped around the cylindrical substrate. In this instance, the coil would have a spring shape.

The coil can be made into the desired shape (e.g., round, square), and the number of loops in the coil can be adjusted, depending upon the application. The typical number of loops in the coil will generally be from about 1 to about 100, and more preferably from about 3 to about 20. Also, the overall dimensions can be adjusted, depending upon the desired end use. In some embodiments, the outer diameter of the coil will be from about 1 µm to about 1,000 mm, more preferably from about 1 mm to about 100 mm, and even more preferably from about 10 mm to about 50 mm. Advantageously, the carbon nanotube films used to form the coil will have a resistance of less than about 5 Ω/sq, preferably less than about 3 Ω/sq, and more preferably from about 0.1 Ω/sq to about 1 Ω/sq. The total resistance of the coil will be less than about 1,000Ω, preferably less than about 500Ω, more preferably less than about 150Ω, and even more preferably from about 0.1Ω to about 50Ω. It is also desirable for the inductor coil to have a maximum frequency of 1 GHz or lower, preferably 500 MHz or lower, and more preferably 200 MHz or lower.

In one embodiment, the carbon nanotube films (and thus the coil, which is formed from such films) will comprise less than about 5% by weight metal, more preferably less than about 2% by weight metal, and more preferably about 0% by weight metal, based upon the total weight of the film taken as 100% by weight. In another embodiment, the carbon nanotube films (and again the coil, which is formed from these films) will comprise less than about 5% by weight of a polymer, more preferably less than about 2% by weight of a polymer, and more preferably about 0% by weight of a polymer, based upon the total weight of the film taken as 100% by weight. In another embodiment, the carbon nanotube films (and thus the coil) will comprise less than about 5% by weight of a conductive polymer, more preferably less than about 2% by weight of a conductive polymer, and more preferably about 0% by weight of a conductive polymer, based upon the total weight of the film taken as 100% by weight. In a further embodiment, both of the above low-metal and low-polymer properties are present. In a further embodiment, both of the above low-metal and low-polymer properties are present. In yet a further embodiment, the carbon nanotube film (and thus the coil) consists essentially of, and preferably consists of, carbon nanotubes.

Regardless of the form, the coil and films can be formed by a number of conventional techniques utilized for printing carbon nanotube films or structures, including spray coating, screen printing, flexographic printing, gravure printing, ink-jet printing, ink filtration, roll-to-roll printing and other methods. One significant advantage of the present invention over the prior art is that, with all of the above options available, the CNT films used in the invention do not have to be grown. As-grown CNTs films have catalytic metal nanoparticles at the ends of the CNTs, and many CNTs could be grown from and attached to a substrate or support. Thus, most as-grown CNTs must be harvested and processed prior to being used for device fabrication. Physically, as-grown CNTs are often highly bundled and not soluble (dispersible) in any solvent in usable levels. They are either in a powder or a forest form on a substrate/support. Chemically, they do not possess a —COOH group as the CNTs used in this invention do. In addition, as-grown CNT's contain a certain amount of undesirable, non-CNT carbonaceous impurities. The CNTs used with the present invention are substantially free of such impurities (i.e., less than about 1% by weight, preferably less than about 0.5% by weight, and more preferably about 0% by weight, based upon the total weight of the CNT film taken as 100% by weight). As-grown CNTs are often not as conductive (between CNTs) as purified CNTs, due to the carbonaceous impurities.

In addition to the above shortcomings, growing CNTs on flexible (mostly polymeric) substrates significantly alters the substrate in a way that is destructive for device fabrication. Further, the CNTs are likely to (mostly) align vertically when grown—from the substrate surface to the top of the film. This can result in poor conductivity in the direction of the inductor coil, making it less usable. The present invention results in random direction CNTs, which is better than the vertical alignment of as-grown CNTs.

It will be appreciated that the inventive tank circuit can comprise both the above-described inductor and capacitor, or one or the other paired with a commercially available version of the other. In other words, the circuit can comprise the above inductor with a commercially available capacitor, or the above conductor with a commercially available inductor. Ideally, the tank circuit is essentially entirely organic (i.e., less than about 2% by weight, preferably less than about 1% by weight, and preferably about 0% by weight of inorganic material such as silicon, metal oxides, and ceramics, based upon the total weight of the circuit components taken as 100% by weight). This is achieved by using essentially entirely organic capacitors and inductors having these same low percentages of inorganic material.

The inductor and capacitor could be wired into the circuit via conventional connection methods, although it is particularly preferred that it be wired with fully combustible (i.e., essentially all organic) materials (e.g., CNT traces). The physical layouts of the inductor and capacitor circuit could vary. For instance, they can be put down on one side of a substrate or two sides of a substrate. Alternatively, the individual components can be put down side-by-side in the substrate plane. The individual components can be put down layer by layer in the substrate plane. They could be in series or parallel, but will most preferably be in parallel. The individual components can be stand-alone inductors or capacitors, or parasitic inductors or capacitors. Furthermore, although the present invention is described in the context of a passive circuit, it will be appreciated that active devices can also be included in the circuit, with exemplary active devices being selected from the group consisting of vacuum tubes, transistors, ring oscillator, inverter, amplifier, diodes, memory, micro-controller, display, analog devices, and logic devices.

The inventive circuit is preferably in communication with a sensor (e.g., radio simulation source). The sensor can be selected depending upon the particular condition to be detected. The proposed sensor uses the resonant frequency induced by the electromagnetic energy (VHF and UHF) from the (preferably) passive "tank" resonance circuit to measure the temperature, humidity, or other environmental changes. The radio-excited system works by using electromagnetic VHF and UHF radiation pulses incident on a classical "tank" resonant circuit that oscillates at a single frequency, $f_r$.

The resonant frequency of the tank circuit and the amplitude of the resonant signals can be modulated by a thermal, mechanical, or chemical signal. Specifically, changes in the signal would affect the resistance, inductance, and capacitance of the circuit. Once that change is detected, a transmitter can transmit a signal to a receiver to alert as to the existence of the changed condition. Suitable sensors (and their accompanying conditions) include those selected from the group consisting of temperature sensors, strain sensors, vibration sensors, humidity sensors, stress sensors, moisture sensors, blast sensors, and structural sensors. As a specific example, for one embodiment, a battery-powered source can be made so that during a temperature query, the source emits a pulse train that stimulates the tank circuit. The tank circuit oscillations can then be detected by the receiver. The resonant frequency of the tank transmissions can be measured and the temperature calculated.

Carbon Nanotube Solutions for Use in Inventive Tank Circuits

Any carbon nanotube solution (or dispersion) that is capable of forming films and electrodes having the above properties is suitable for use in the present invention. Suitable CNTs for use in the present inventive method include any raw single-walled, double-walled, or multi-walled CNTs (SWCNTs, DWCNTs, and MWCNTs, respectively). Preferably, the CNTs are pristine, that is, CNTs having little or no sidewall defects, existing functionalization, or doping. Non-pristine CNTs may be used, but the existing functionalization or doping may be damaged by the acid treatment, and the resulting conductivity might be affected. Exemplary types of CNTs for this process include, but are not limited to, CG200 CNTs and SG65 CNTs (available from SWeNT), XBC3350 CNTs (available from CCNI), HiPco™ CNTs (available from NanoIntegris), as well as those available from Thomas Swan and CheapTubes.

In one embodiment, the solution or dispersion comprise less than about 5% by weight metal, more preferably less than about 2% by weight metal, and more preferably about 0% by weight metal, based upon the total weight of the solids in the solution or dispersion taken as 100% by weight. In another embodiment, the solution or dispersion will comprise less than about 5% by weight of a polymer, more preferably less than about 2% by weight of a polymer, and more preferably about 0% by weight or a polymer, based upon the total weight of the solids in the solution or dispersion taken as 100% by weight. In another embodiment, the solution or dispersion will comprise less than about 5% by weight of a conductive polymer, more preferably less than about 2% by weight of a conductive polymer, and more preferably about 0% by weight of a conductive polymer, based upon the total weight of the solids in the solution or dispersion taken as 100% by weight. In a further embodiment, both of the above low-metal and low-polymer properties are present. In yet a further embodiment, the solution or dispersion consists essentially of, and preferably consists of, carbon nanotubes and the solvent system utilized.

One preferred such solution comprises carbon nanotubes functionalized with aromatic moieties, such as pyrene, and is described in U.S. Patent Application Publication No. 2012/0326093, incorporated by reference herein. Such solutions can be formed by reacting CNTs, polyaromatic moieties (provided as part of a compound comprising at least one polyaromatic moiety), and an acid. The CNTs can first be added to the acid for breaking apart the CNTs that may be bundled or clustered together, followed by addition of the compound comprising at least one polyaromatic moiety. Alternatively, the compound comprising at least one polyaromatic moiety can be combined with the acid, followed by addition of the CNTs. As a further alternative, the compound comprising at least one polyaromatic moiety and CNTs could first be combined, followed by addition of the acid.

Regardless of the order of addition, the mixture should be stirred until a consistent dispersion is achieved, i.e., until the dispersion is unchanging and essentially stable. This will typically take from about 6 hours to about 4 days, more preferably from about 10 hours to about 2 days, and even more preferably from about 12 hours to about 24 hours. The temperature of the mixture during this time is preferably from about 0° C. to about 100° C., more preferably from about 15° C. to about 60° C., and even more preferably from about 20° C. to about 25° C.

After a consistent reaction mixture has been achieved, the temperature of the mixture is preferably lowered to a range of from about −5° C. to about 40° C., and even more preferably from about −5° C. to about 10° C. This can be accomplished by transferring the resulting dispersion to ice or ice cold water. At this stage, the pH of the dispersion is from about 0 to about 1, and more preferably from about 0 to about 0.5. The pH is preferably adjusted by addition of a base (e.g., concentrated ammonium hydroxide) to the highly acidic dispersion, raising the pH to a range of from about 0 to about 10, and even more preferably from about 0 to about 8. The solution is then preferably filtered and washed with deionized ("DI") water and dilute ammonium hydroxide to yield the inventive carbon nanotube solid or dispersion (depending upon whether cross flow filtration was used) that can be used to prepare inks, for example.

Suitable compounds comprising at least one polyaromatic moiety for use in the inventive method include any unsubstituted or substituted polyaromatics that possess a physical and electronic structure allowing them to be non-covalently bonded to the surface of the CNTs. Preferably, the polyaromatic moieties are planar or have a large planar area and contain carbon ranges from about $C_{10}$ to about $C_{100}$, more preferably from about $C_{12}$ to about $C_{30}$, and even more preferably from about $C_{16}$ to about $C_{20}$. Exemplary polyaromatic compounds include substituted (at any position) and unsubstituted versions of compounds selected from the group consisting of naphthalene, anthracene, phenanthracene, pyrene, tetracene, tetraphene, chrysene, triphenylene, pentacene, pentaphene, perylene, benzo[a]pyrene, coronene, antanthrene, corannulene, ovalene, graphene, fullerene, cycloparaphenylene, polyparaphenylene, cyclophene, and similar molecules, as well as compounds containing moieties of the foregoing. Exemplary substituted polyaromatic compounds include those selected from the group consisting of 1-pyrenebutyric acid, 1-pyrenemethylamine hydrochloride, rubrene, pyrene, and triphenylene.

Suitable acids for use in the inventive process include any strong acid (and preferably a sulfonating strong acid) or superacid. Preferably the acid has a pKa of less than about −1, preferably less than about −12, and more preferably from about −12 to about −14. Exemplary acids include, but are not limited to, sulfuric acid (oleum), chlorosulfonic acid, triflic acid, p-toluenesulfonic acid, and mixtures thereof.

The CNTs and compound comprising at least one polyaromatic moiety are preferably utilized in the inventive method at levels such that the molar ratio of CNTs to polyaromatic moieties is from about 25:75 to about 75:25, preferably from about 35:65 to about 65:35, more preferably from about 45:55 to about 55:45, and even more preferably about 50:50. The acid (or acids, if a mixture of acids is utilized) is preferably utilized at levels of from about 90% to about 99.99% by weight, more preferably from about 95% to about 99.9% by weight, and even more preferably from about 98% to about 99.8% by weight, based upon the total weight of the dispersion taken as 100% by weight.

In one embodiment, the resulting dispersion is essentially free of surfactants. That is, surfactants are utilized in the method and/or included in the final dispersion at levels of less than about 1% by weight, preferably less than about 0.5% by weight, and more preferably about 0% by weight, based upon the total weight of the CNTs taken as 100% by weight.

In another embodiment, the CNT dispersions consist essentially of, or even consist of, the CNTs, compound comprising at least one polyaromatic moiety, and acid (where at least some and maybe all of the acid is reacted with the compound comprising at least one polyaromatic moiety).

It will be appreciated that the above-described dual functionalization of the inventive method allows the CNTs to be dispersed at concentrations of greater than about 0.5 g/L (about 0.05% by weight), preferably greater than about 1 g/L (about 0.10%), preferably greater than about 1.5 g/L, and more preferably from about 1.5 g/L to about 3 g/L without damaging their desirable electronic properties. Furthermore, further post-processing steps are not needed beyond addition of any solvents for further dispersing the CNTs, preparing inks, etc. That is, conductive additives or dopants are not needed once the CNTs are dispersed.

EXAMPLES

The following examples set forth preferred methods in accordance with the invention. It is to be understood, however, that these examples are provided by way of illustration and nothing therein should be taken as a limitation upon the overall scope of the invention.

Example 1

Printing of Circular and Rectangular CNT Inductor Coils

The inductor coils were deposited on a polyethylene terephthalate ("PET") substrate by spray coating a solution of CNTs functionalized with 1-pyrenemethylamine (CN-TRENE® 3010 A8-R, Brewer Science, Inc., Rolla, Mo.). The spray coater was equipped with a Sonotek ultrasonic spray nozzle. The spray nozzle was located at about 1.5 inch above the substrate surface (sitting on a heated platen) with the sonication power set at 3 W. The material spray rate was set at 10 mL/hour. The spray coating line space was set at 1 mm with a spray coating speed of 60 mm/sec. A 0.007 inch thick tungsten stencil with the desired inductor coil pattern was placed on top of the substrate surface. Spray coating was carried out using the above-mentioned parameters. Multiple layer of coatings was required to achieved the desired thickness/resistance.

Figure 1:
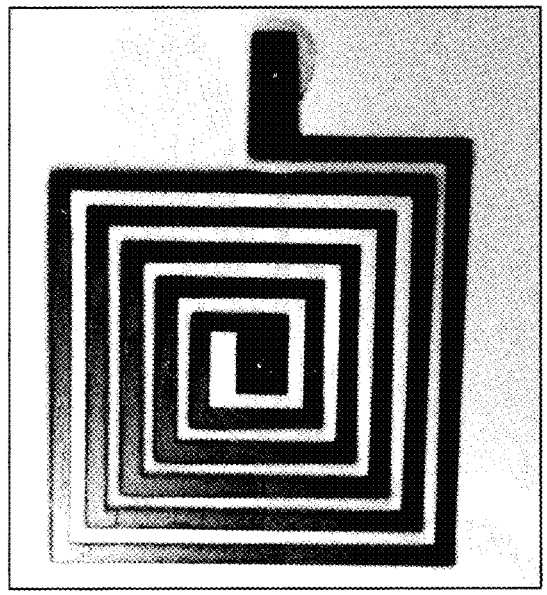
FIG. 1 is a photograph showing the square printed CNT inductor coil prepared in Example 1.
Figure 2:
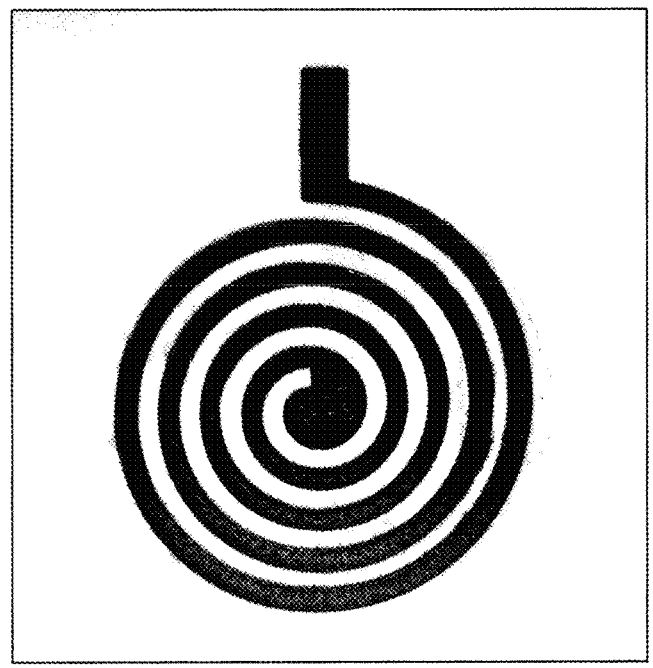
FIG. 2 is a photograph showing the circular printed CNT inductor coil prepared in Example 1.

After deposition, the platen was heated to 130° C., and no post-deposition processing was necessary. The outer diameter and width of the 5-turn circular inductor coils were 20 mm and 0.9 mm, respectively. The total resistance of the circular CNT inductor coil was measured using a multimeter from the outside to the inside. That resistance was 166Ω. FIG. 1 shows a square inductor coil that was formed, while FIG. 2 shows the circular inductor coil that was formed. The total resistance of the circular CNT inductor coil was 166Ω, and the total resistance of the square CNT inductor coil was 220 Ω.

Example 2

Testing of CNT Inductor Coil with Commercially Available Capacitor

Figure 3:
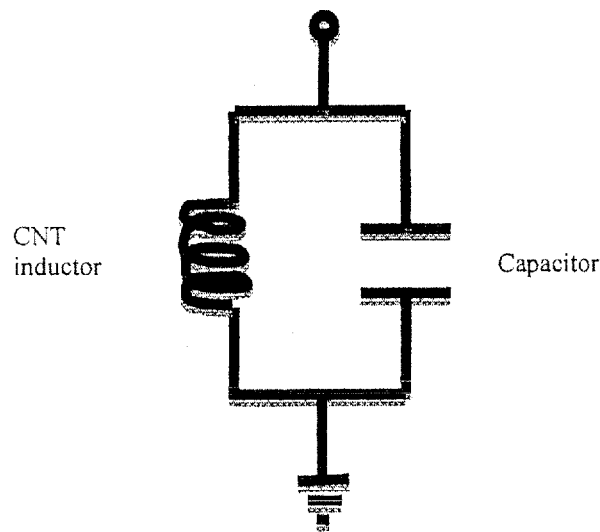
FIG. 3 is an inductor capacitor tank circuit wiring diagram to illustrate the equipment set-up from Example 2.

The circular CNT-based inductor coil from Example 1 was wired to a prototype circuit board as shown in FIG. 3. The capacitor used was a 12 pF Ceramic capacitor (XICON Passive Components, Arlington, Tex.). The circuit board was connected to the impedance test kit and an impedance analyzer (HP4195A, Agilent Technologies, Santa Clara, Calif.) by RF connectors. The input into the circuit was 500 mV.

Figure 4:
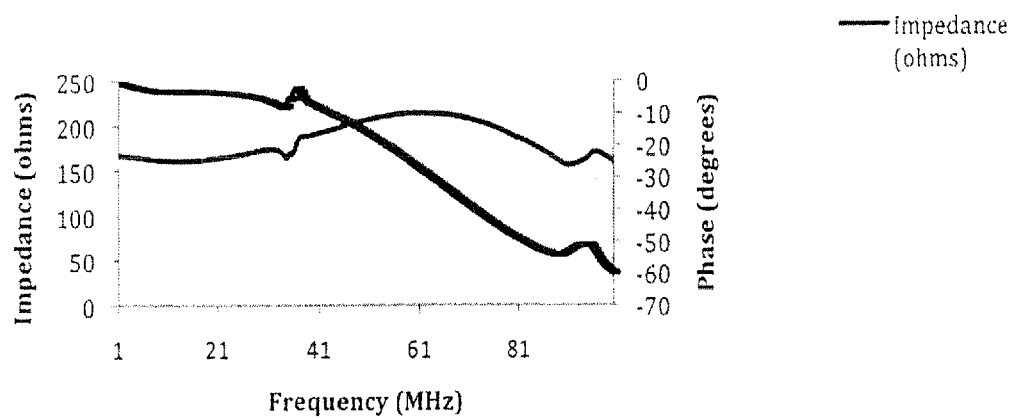
FIG. 4 is an impedance and phase plot of the CNT circular inductor coil with a commercially available capacitor as described in Example 2.

An impedance and phase plot of the CNT inductor was created using an impedance analyzer. FIG. 4 shows this plot for the CNT inductor with the 12 pF capacitor.

Example 3

Testing of CNT Capacitor with a Commercially Available Inductor

Figure 5:
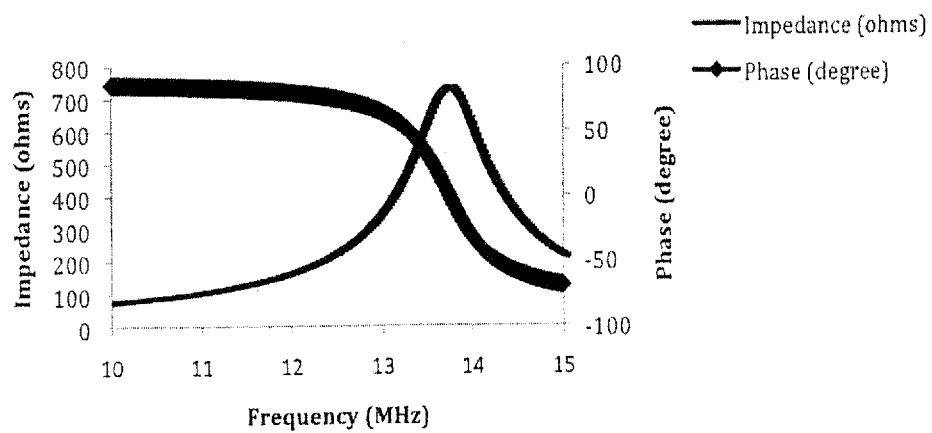
FIG. 5 is an impedance and phase plot for a commercially available inductor with the CNT capacitor of Example 3.

A CNT capacitor was made by spray coating the CNT solution used in Example 1 to form electrodes. A commercial grade polyimide thin film (Kapton, from DuPont) was used as the dielectrics. The wiring scheme was the same as that shown in FIG. 3. FIG. 5 shows the impedance and phase plot for a 1-μH polystyrene film inductor (XICON Passive Components) with the CNT capacitor. The input into the circuit was 500 mV.

Example 4

Comparative Example

Testing of Ag Inductor Coil with Commercially Available Capacitor

Figure 6:
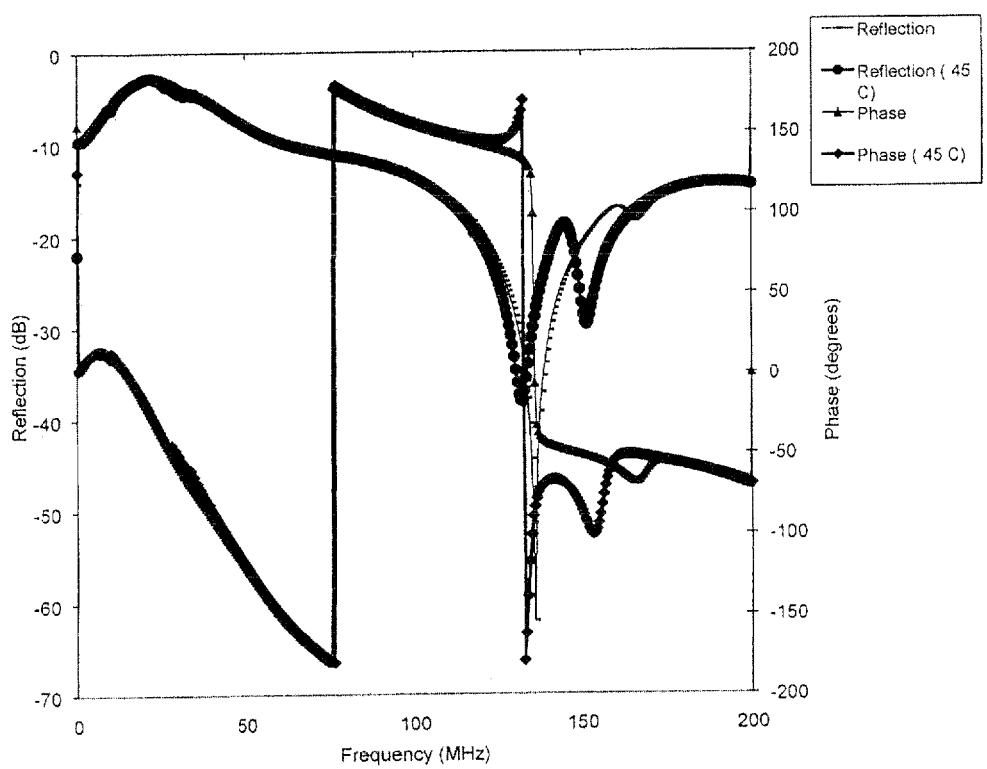
FIG. 6 is a graph showing reflection and phase responses for an Ag inductor with a 47 pF capacitor as shown in Example 4.

A silver nanoparticle inductor coil was printed by a Uni-Jet printer. The printing head, with a 5 pL cartridge, was placed at 0.3 mm above the polyimide substrate surface (Kapton film). Nano-Ag ink (from Advanced Nano Product, Silvergel DGP 40LT-15C) was printed with a printing head jetting frequency of 300 Hz. The printed Ag inductor coils were then cured at 130° C. for 20 minutes. The outer diameter and width of the 6-turn square inductor coils was 40 mm and 1.46 mm, respectively. The total resistance of the square silver nanoparticle inductor coil was 50Ω. The square, Ag-based inductor coil was connected in a prototype circuit as shown in FIG. 3. The capacitor used was a 47 pF ceramic capacitor (XICON Passive Components). The circuit board was connected to the test kit by RE connectors. The reflection frequency responses of inductor coils were characterized by an Agilent network analyzer with a transmission/reflection test kit. The input into the circuit was 1 mW. Resonant frequency and amplitude responses of the Ag inductor with the 47 pF capacitor were taken at room temperature and at 45° C. FIG. 6 shows this plot for the Ag inductor with the 47 pF capacitor. Resonant frequency and amplitude responses were very sensitive to temperature change.

Example 5

Testing of CNT Inductor Coil with Commercially Available Capacitor

Figure 7:
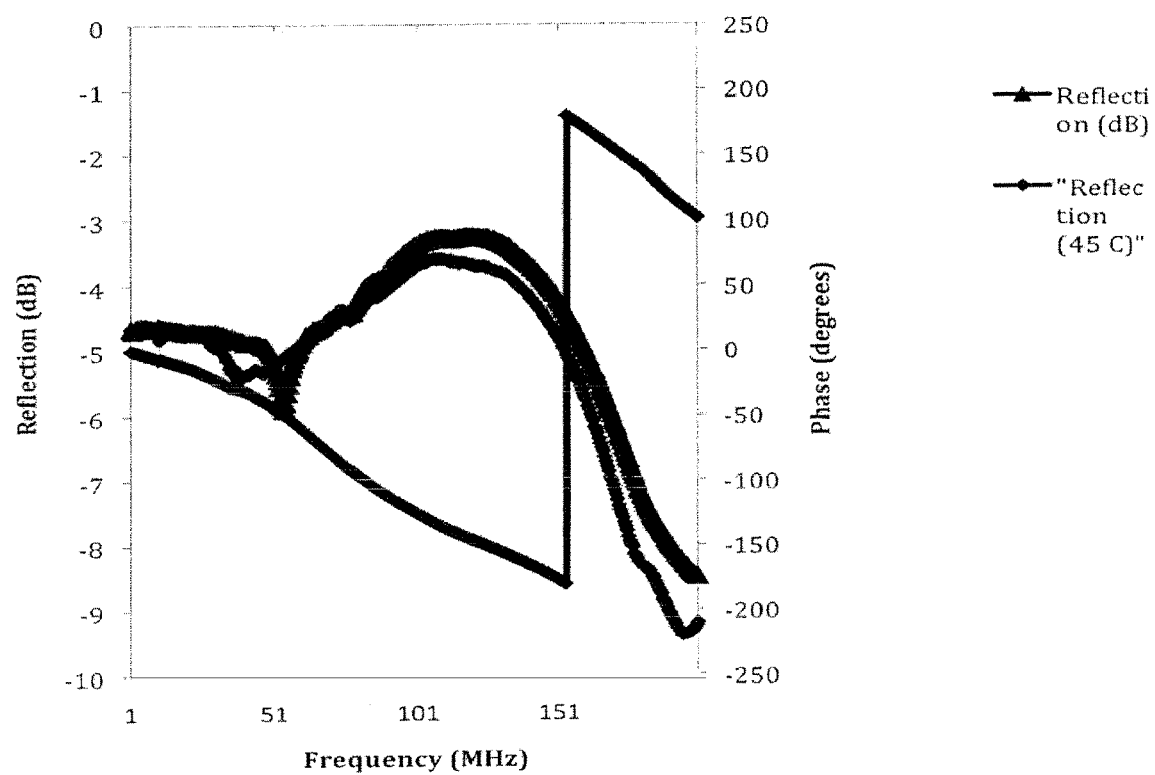
FIG. 7 is a graph showing reflection and phase responses for a CNT inductor with a 4.7 pF commercially available capacitor as described in Example 5.

A circular CNT-based inductor coil from Example 1 was placed into a prototype circuit as shown in FIG. 3. The capacitor used was a 4.7 pF ceramic capacitor (XICON Passive Components). The circuit board was connected to the test kit by RF connectors. The reflection frequency responses of inductor coils were characterized by an Agilent network analyzer with a transmission/reflection test kit. The input into the circuit was 1 mW. Resonant frequency and amplitude responses of the CNT inductor with the 4.7 pF capacitor were taken at room temperature and at 45° C. FIG. 7 shows this plot for the CNT inductor with a 4.7 pF capacitor. Resonant frequency and amplitude responses were sensitive to temperature change.

Example 6

Testing of CNT Inductor Coil with CNT-Kapton Capacitor

The CNT inductor coils were redesigned by increasing the coil width and decreasing the coil gap. The CNT films used to make the coils were screen printed on polyimide (Kapton, from Dupont) substrates and were laser-cut into concentric coils. Specifically, the coils were printed with a squeegee (CSJ-M75-X06-L: Shore 75 A-scale, EXTREME profile from Clark Product Renovation) onto 0.005 inch thick the film using an ATMA AT-PD series screen printer. A 60-mesh polyester screen was used. The squeegee was set at 750 mm/sec, and the squeegee pressure was 0.5 bar with an angle of 5°. The screen printed inductor coils were cured at about 105° C. for about 7.5 minutes.

Figure 8:
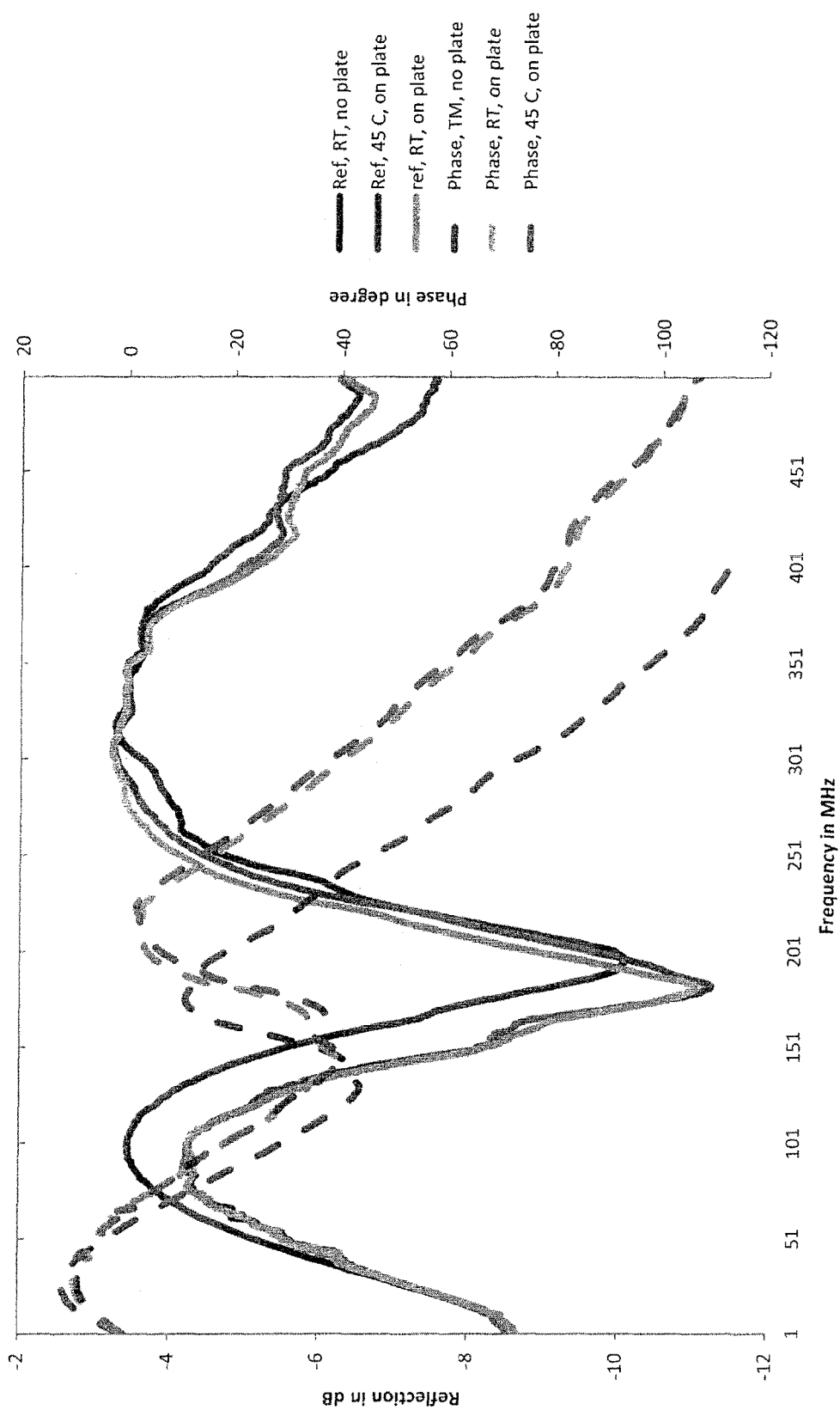
FIG. 8 is a graph with reflection and phase responses for a CNT inductor and a CNT capacitor.
Figure 9:
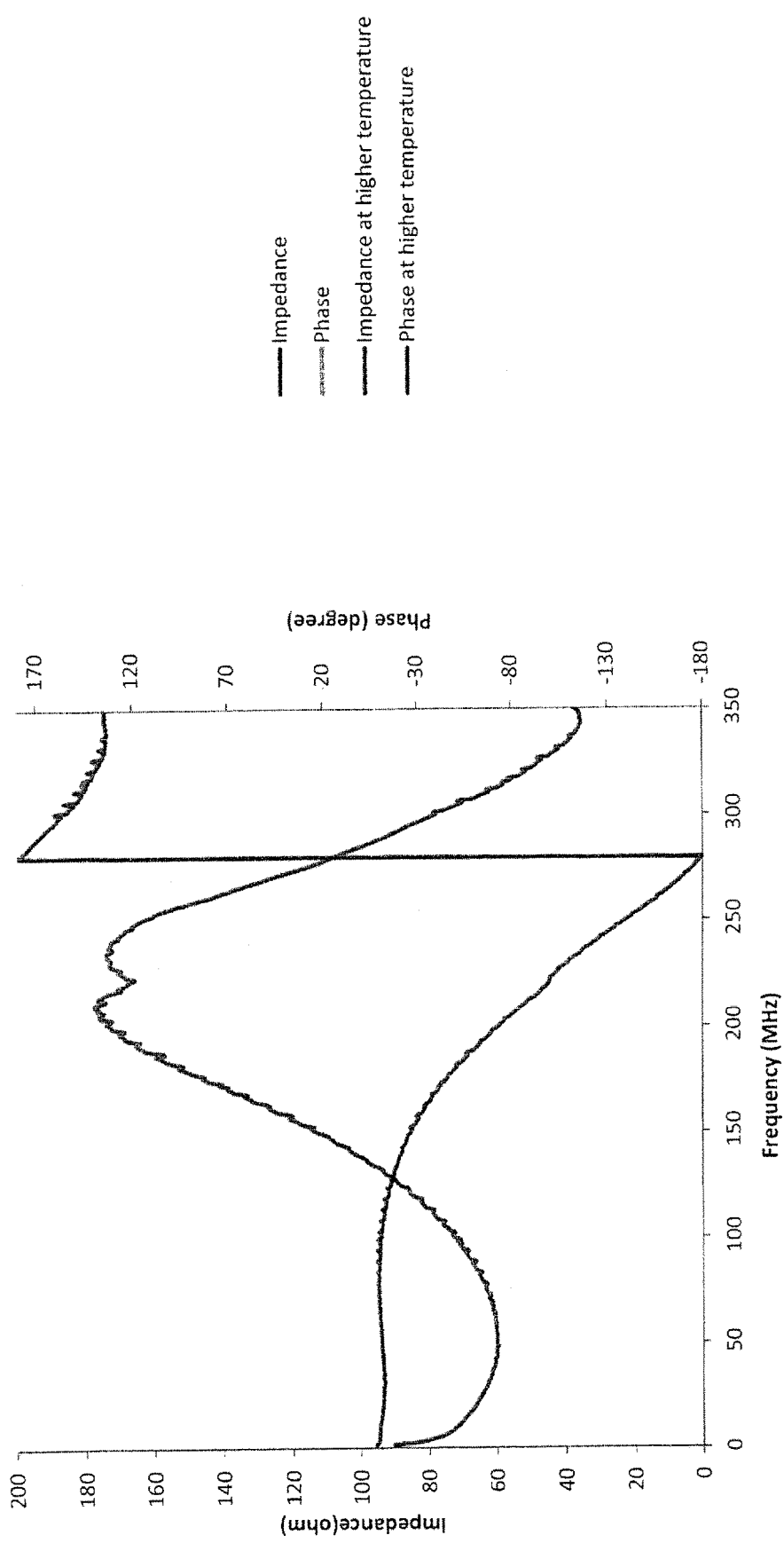
FIG. 9 is a graph of the resonant responses for a CNT inductor and a CNT-FR-4capacitor (Example 7)

The CNT capacitor was made using spray coated CNTs as electrodes and commercial grade Kapton thin film as dielectrics. The coil and capacitor were connected in a loop, and they were connected to the test kit by industrial standard coaxial connectors (i.e., BNC connectors). The reflection and phase vs frequency responses of the resonator were characterized by an Agilent network analyzer with a transmission/reflection test kit. The input into the circuit was 1 mW. Resonant frequency responses were taken at room temperature and at 45° C. as shown in FIG. 8. Resonant frequency and amplitude responses were sensitive to temperature change.

Example 7

Testing of CNT Inductor Coil with CNT-FR-4 Capacitor

The CNT inductor coils were screen printed on an FR-4 substrate in-house. The CNT-FR-4 capacitor was made using spray coated CNT and copper film as electrodes and commercial grade FR-4 thin film as dielectrics. The rest of the description is similar to that of Example 6. Resonant frequency responses were taken at room temperature and at 45° C. shown in FIG. 10. Both resonant frequency and amplitude responses were not very sensitive to temperature change.

We claim:
1. A tank circuit comprising:
   (a) a capacitor comprising a first carbon nanotube film, a second carbon nanotube film, and a dielectric layer, said dielectric layer being positioned between said first and second carbon nanotube films; and
   (b) an inductor operatively connected to said capacitor, said inductor comprising a coil supported on a substrate, said coil comprising a third carbon nanotube film directly on said substrate.

2. The tank circuit of claim 1, said first and second carbon nanotube films each having respective resistances of less than about 5 Ω/sq.

3. The tank circuit of claim 1, said third carbon nanotube film having a resistance of less than about 5 Ω/sq.

4. The tank circuit of claim 1, wherein said capacitor and inductor are connected in parallel.

5. The tank circuit of claim 1, said circuit further comprising an active device.

6. The tank circuit of claim 5, wherein said active device is selected from the group consisting of vacuum tubes, transistors, ring oscillator, inverter, amplifier, diodes, memory, micro-controller, display, analog devices, and logic devices.

7. The tank circuit of claim 1, wherein each of said first, second, and third carbon nanotube films individually comprise less than about 5% by weight metal, based upon the total weight of the film taken as 100% by weight.

8. The tank circuit of claim 1, wherein each of said first, second, and third carbon nanotube films individually comprise less than about 5% by weight polymer, based upon the total weight of the film taken as 100% by weight.

9. The tank circuit of claim 1, wherein each of said first, second, and third carbon nanotube films consists essentially of said carbon nanotubes.

10. The tank circuit of claim 1, wherein said dielectric layer is selected from the group consisting of polyimide, poly(vinylidenefluoride), dedoped polyaniline, polystyrene, polyacrylate, epoxies, epoxy acrylates, parylene, polyethylene, and poly(methyl methacrylate) layers.

11. The tank circuit of claim 1, wherein said substrate is selected from the group consisting of polyethylene terephthalate, polyimide, FR-4, breadboard, a poly(methyl methacrylate), polyacrylate, epoxy, polyurethane, paper, polyester, and polyethylene substrates.

12. The tank circuit of claim 1, further comprising a sensor in communication with the tank circuit.

13. The tank circuit of claim 12, wherein said sensor is selected from the group consisting of temperature sensors, strain sensors, stress sensors, moisture sensors, blast sensors, and structural sensors.

14. The tank circuit of claim 1, wherein each of said first, second, and third carbon nanotube films individually comprises less than about 2% by weight of inorganic material, based upon the total weight of the film taken as 100% by weight.

15. The tank circuit of claim 1, wherein each of said first, second, and third carbon nanotube films comprises random direction carbon nanotubes.

* * * * *